(12) United States Patent
Kim

(10) Patent No.: US 8,023,908 B2
(45) Date of Patent: Sep. 20, 2011

(54) INTERMODULATION SIGNAL GENERATOR OF POWER AMPLIFIER AND PRE-DISTORTION LINEARIZER HAVING THE SAME

(75) Inventor: Sang Won Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 357 days.

(21) Appl. No.: 12/442,739

(22) PCT Filed: Oct. 19, 2007

(86) PCT No.: PCT/KR2007/005148
§ 371 (c)(1),
(2), (4) Date: Mar. 25, 2009

(87) PCT Pub. No.: WO2008/069436
PCT Pub. Date: Jun. 12, 2008

(65) Prior Publication Data
US 2010/0001801 A1    Jan. 7, 2010

(30) Foreign Application Priority Data

Dec. 7, 2006 (KR) ......................... 10-2006-0123895

(51) Int. Cl.
*H04B 1/04* (2006.01)
(52) U.S. Cl. ..................................... 455/114.3; 375/296
(58) Field of Classification Search .................. None
See application file for complete search history.

(56) References Cited

U.S. PATENT DOCUMENTS

| | | | |
|---|---|---|---|
| 5,600,472 A | | 2/1997 | Uesaka |
| 5,877,653 A | * | 3/1999 | Kim et al. ............ 330/149 |
| 6,172,562 B1 | * | 1/2001 | Cazaux et al. ............ 330/149 |
| 6,340,917 B1 | | 1/2002 | Villemazet et al. |
| 6,466,084 B1 | | 10/2002 | Ciemniak |
| 6,570,445 B1 | | 5/2003 | Perrin et al. |
| 7,948,311 B2 | * | 5/2011 | Suzuki et al. ............ 330/149 |
| 2003/0147116 A1 | | 8/2003 | Shpantzer et al. |

FOREIGN PATENT DOCUMENTS

KR    1020020041951 A    6/2002

(Continued)

OTHER PUBLICATIONS

International Search Report: mailed Jan. 28, 2008; PCT/KR2007/005148.

*Primary Examiner* — Cassandra Cox
(74) *Attorney, Agent, or Firm* — Ladas & Parry LLP

(57) ABSTRACT

Provided are an intermodulation signal generator of a power amplifier and a pre-distortion linearizer having the same. The intermodulation signal generator of the power amplifier includes: a circulator for outputting a radio-frequency (RF) input signal input via a first port to a second port and outputting an intermodulation signal input via the second port to a third port; a directional coupler for shifting phases of the input signals input via the second port of the circulator to divide or couple the phase-shifted signals; first and second Schottky diodes, disposed symmetrically, for receiving the signals divided by the directional coupler to generate intermodulation signal components; first and second phase adjusters, disposed symmetrically, for controlling phases of the intermodulation signal components gene rated by the first and second Schottky diodes by means of first and second bias voltages; and first and second scalers, disposed symmetrically, for controlling magnitudes of the intermodulation signal components generated by the first and second Schottky diodes by means of third and fourth bias voltages. The above-described intermodulation signal generator can be applied to a power amplifier of a high-performance downscaled communication system.

13 Claims, 10 Drawing Sheets

FOREIGN PATENT DOCUMENTS

| | | |
|---|---|---|
| KR | 1020020068735 A | 8/2002 |
| KR | 10-0353709 B1 | 9/2002 |
| KR | 1020040106018 A | 12/2004 |
| KR | 1020050079713 A | 8/2005 |
| KR | 1020060009741 A | 2/2006 |
| WO | 02/067362 A1 | 8/2002 |

* cited by examiner (PRIOR ART)
[Fig. 1]
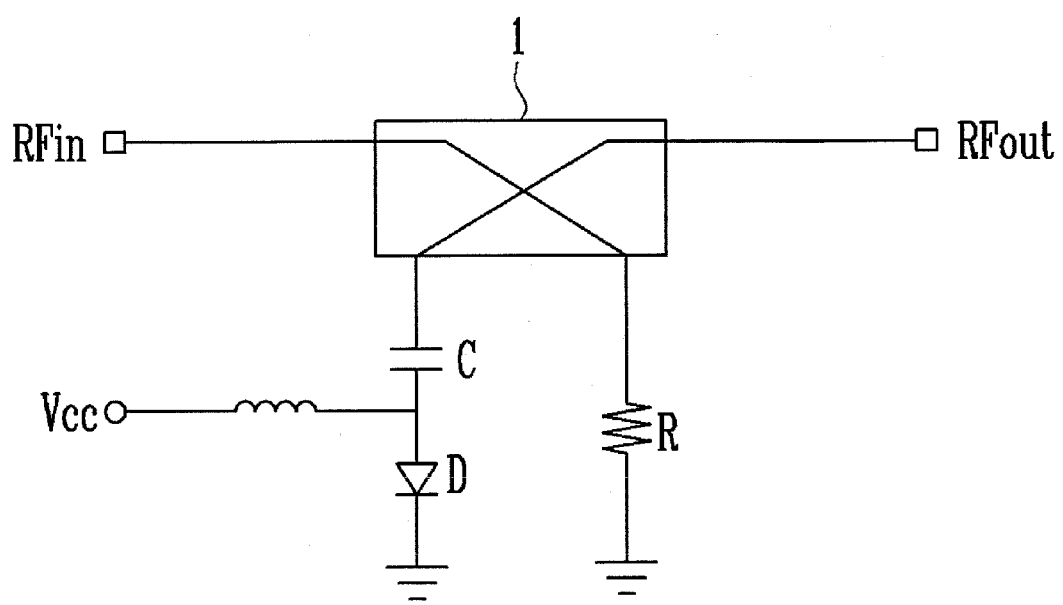

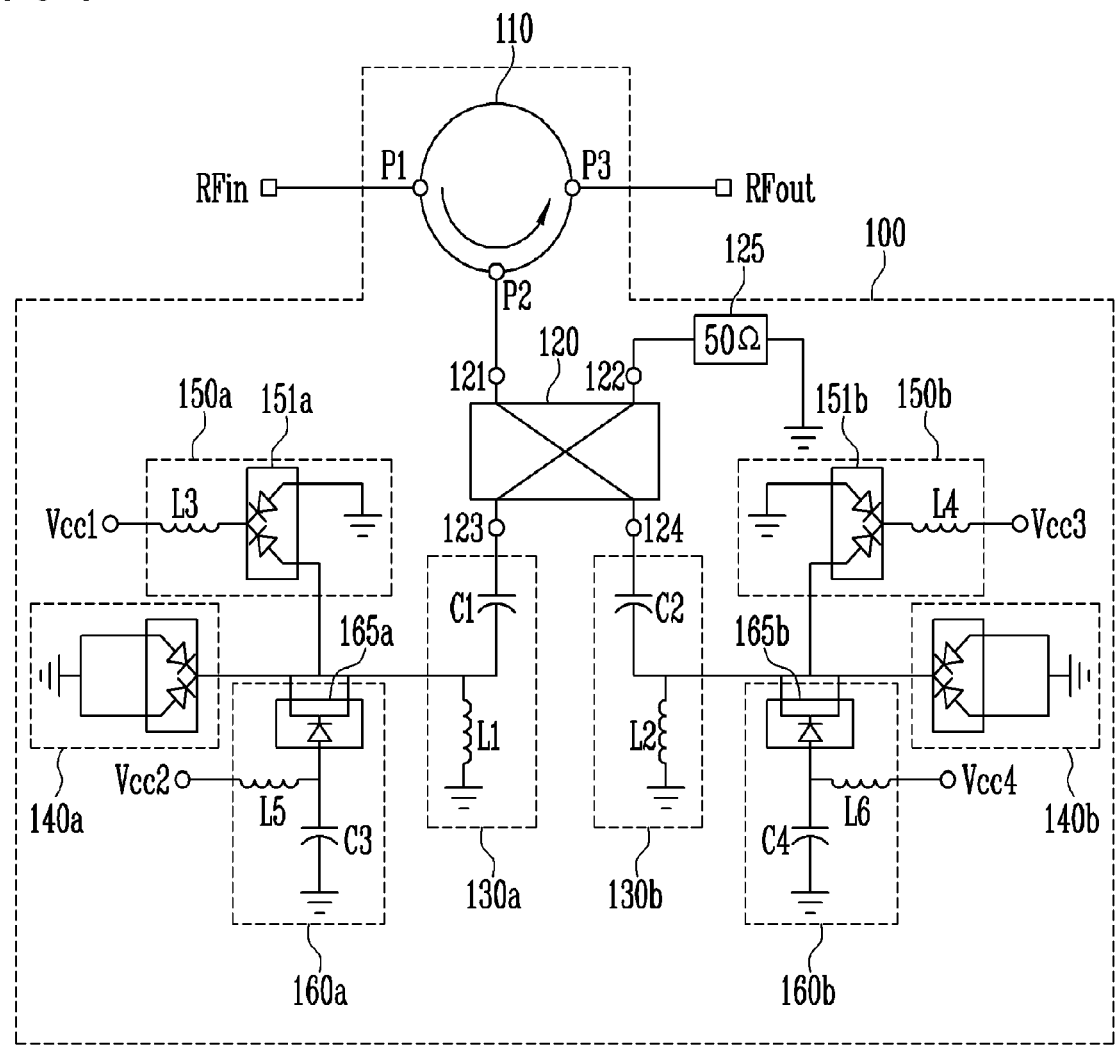
[Fig. 2]

[Fig. 3]
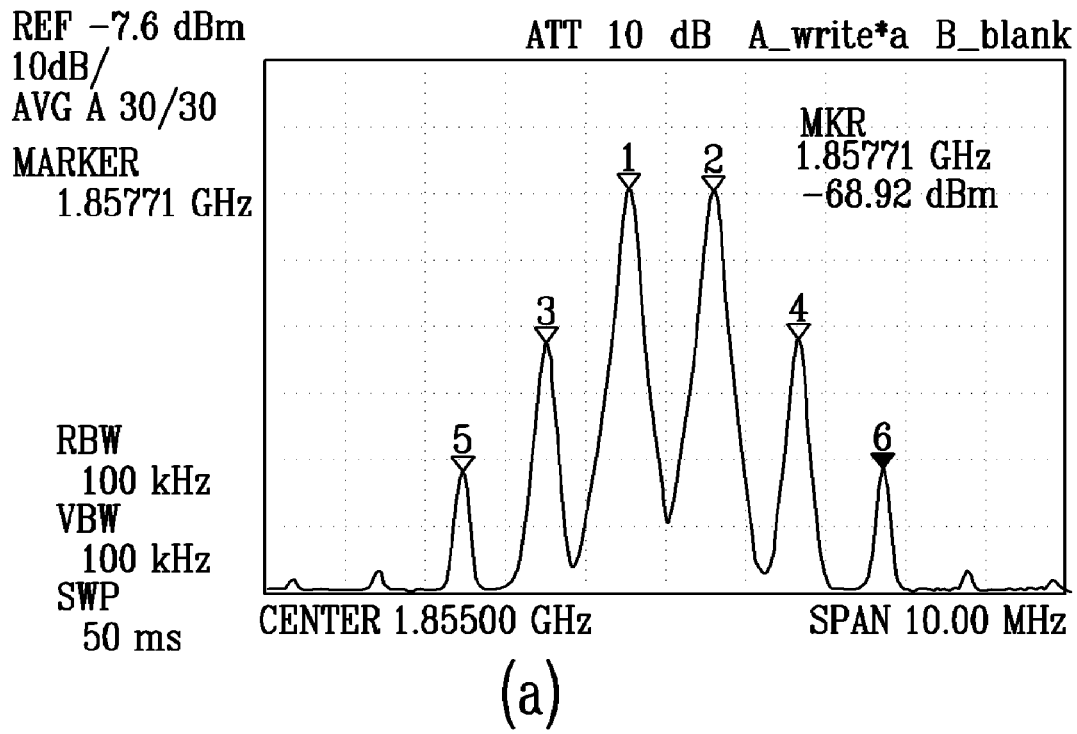
(a)
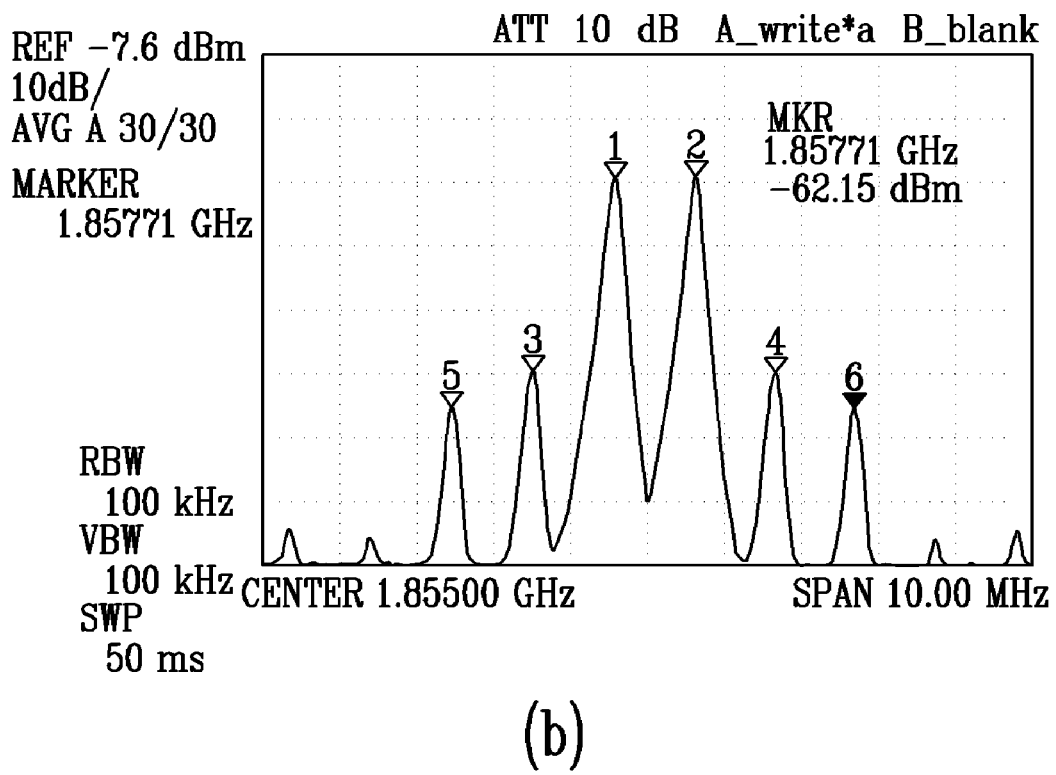
(b)

[Fig. 4]
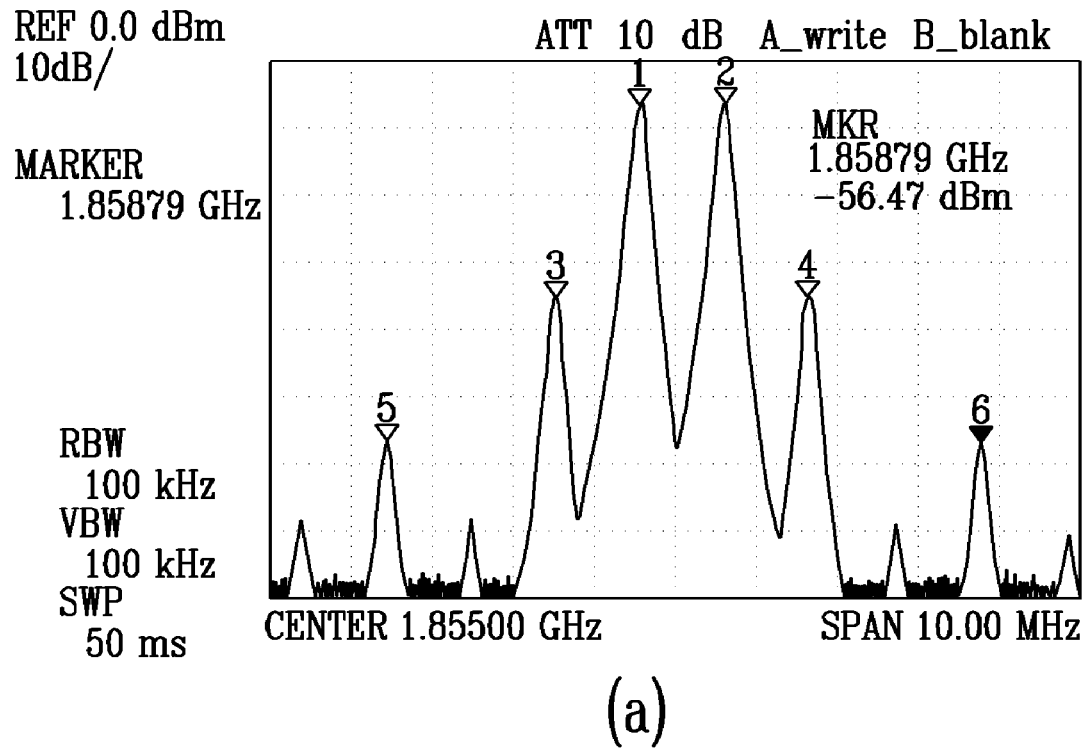
(a)
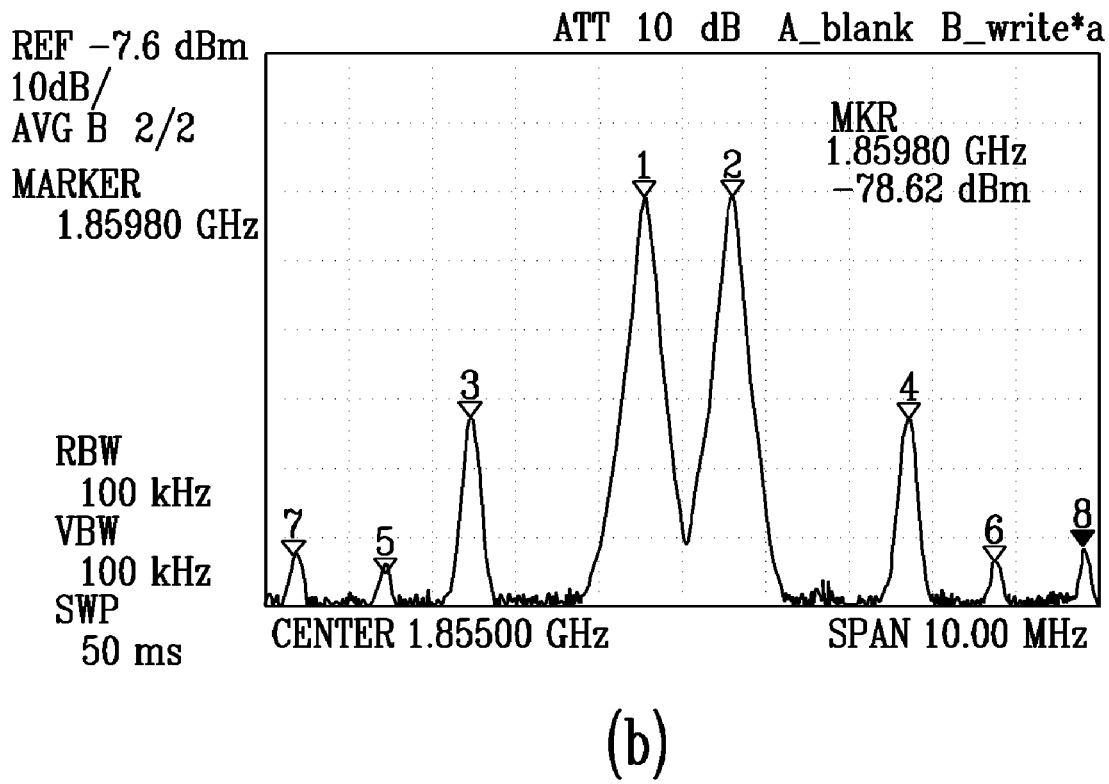
(b)

[Fig. 5]
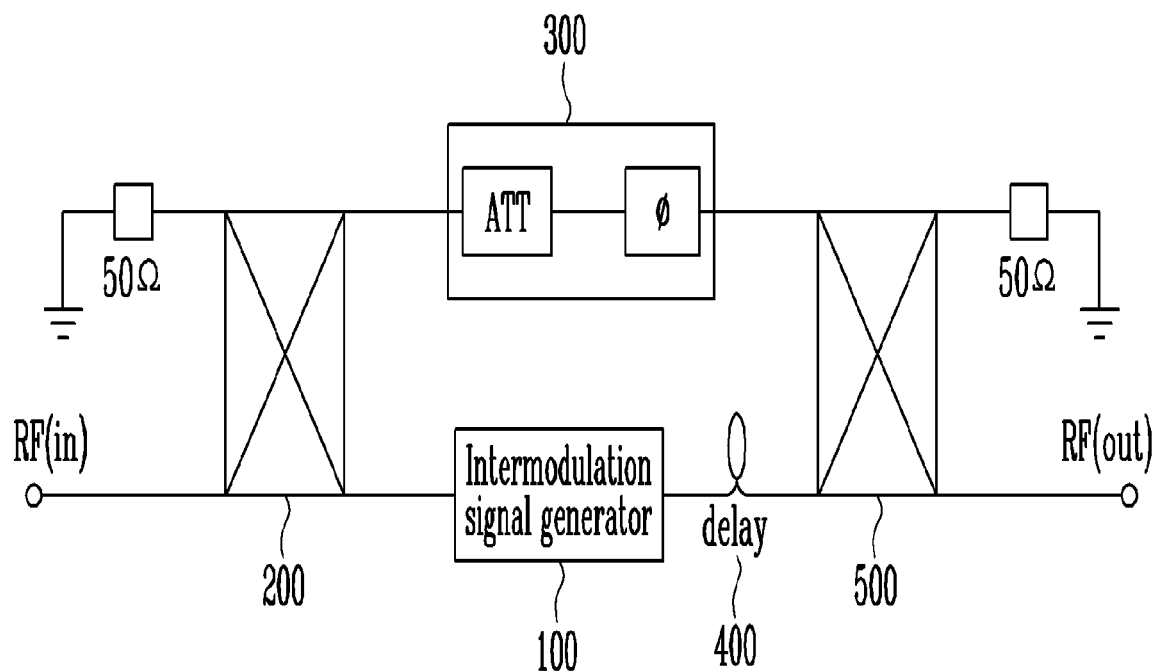

[Fig. 6]
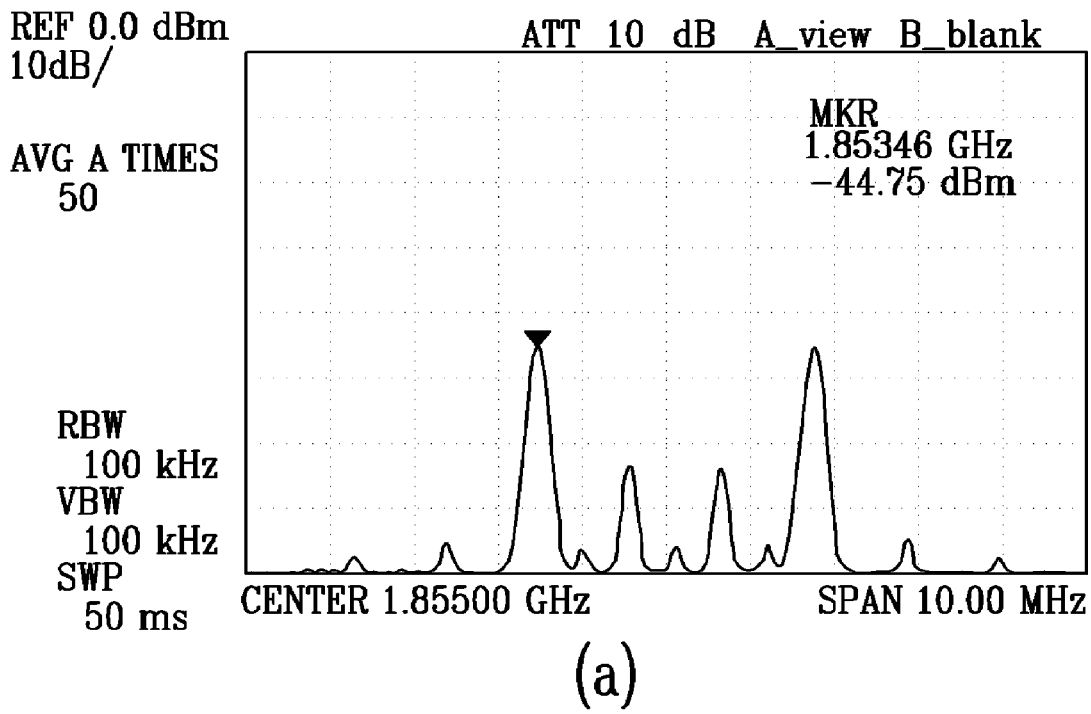
(a)
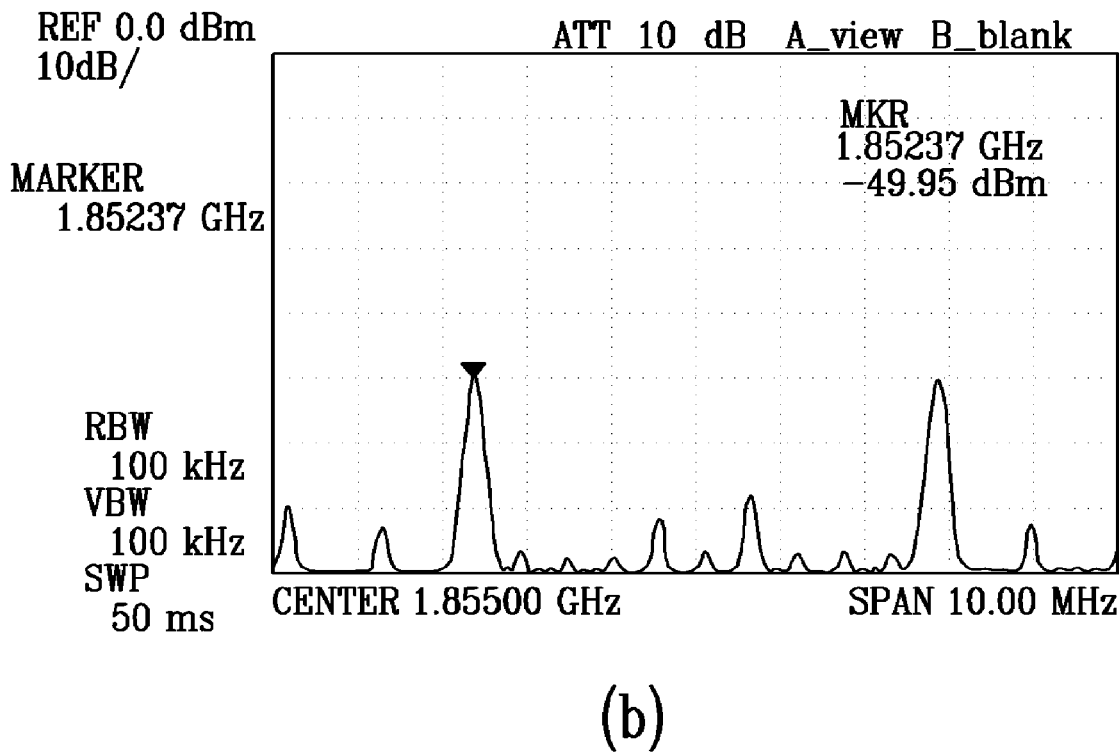
(b)

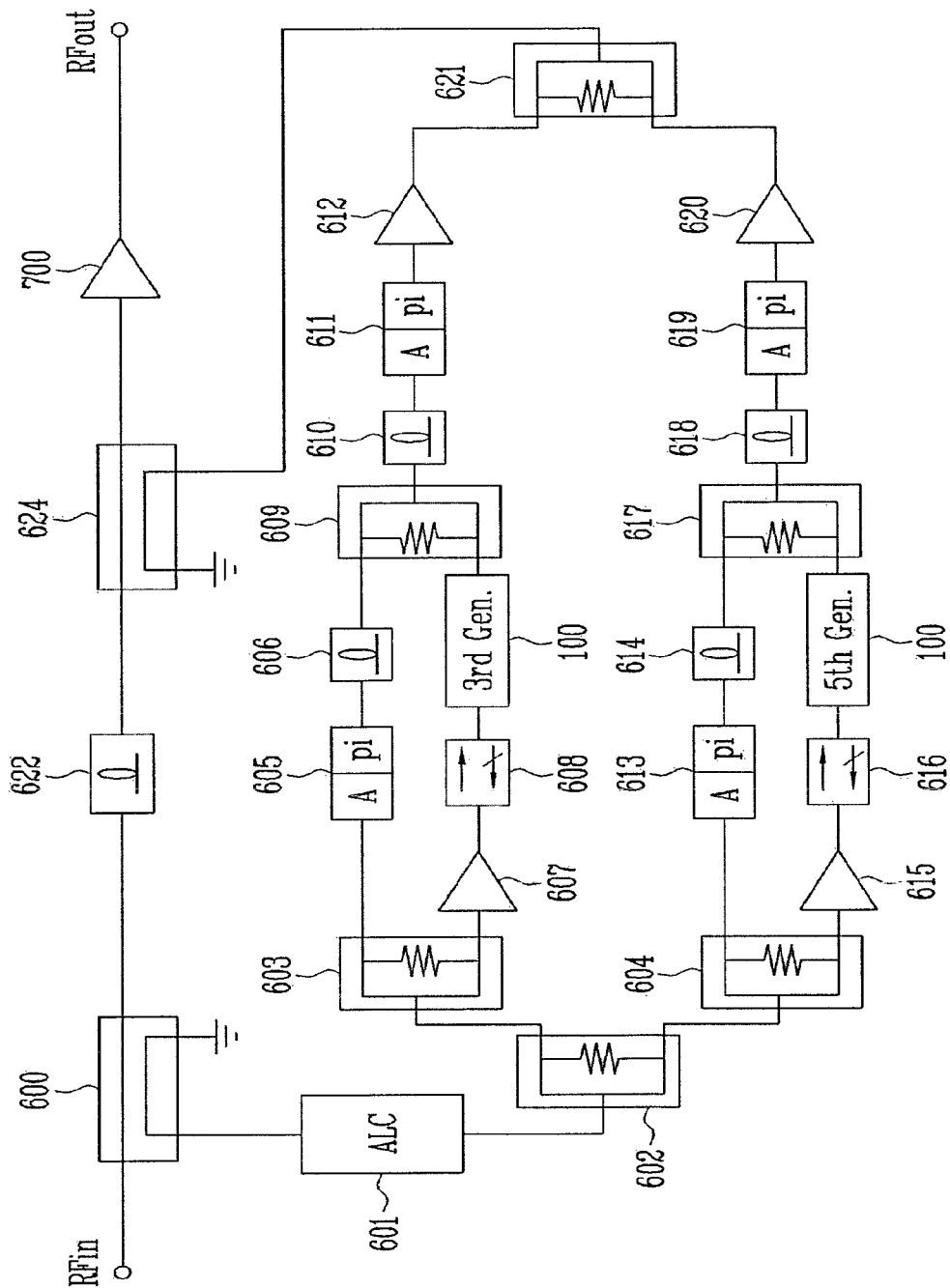
[Fig. 7]

[Fig. 8]
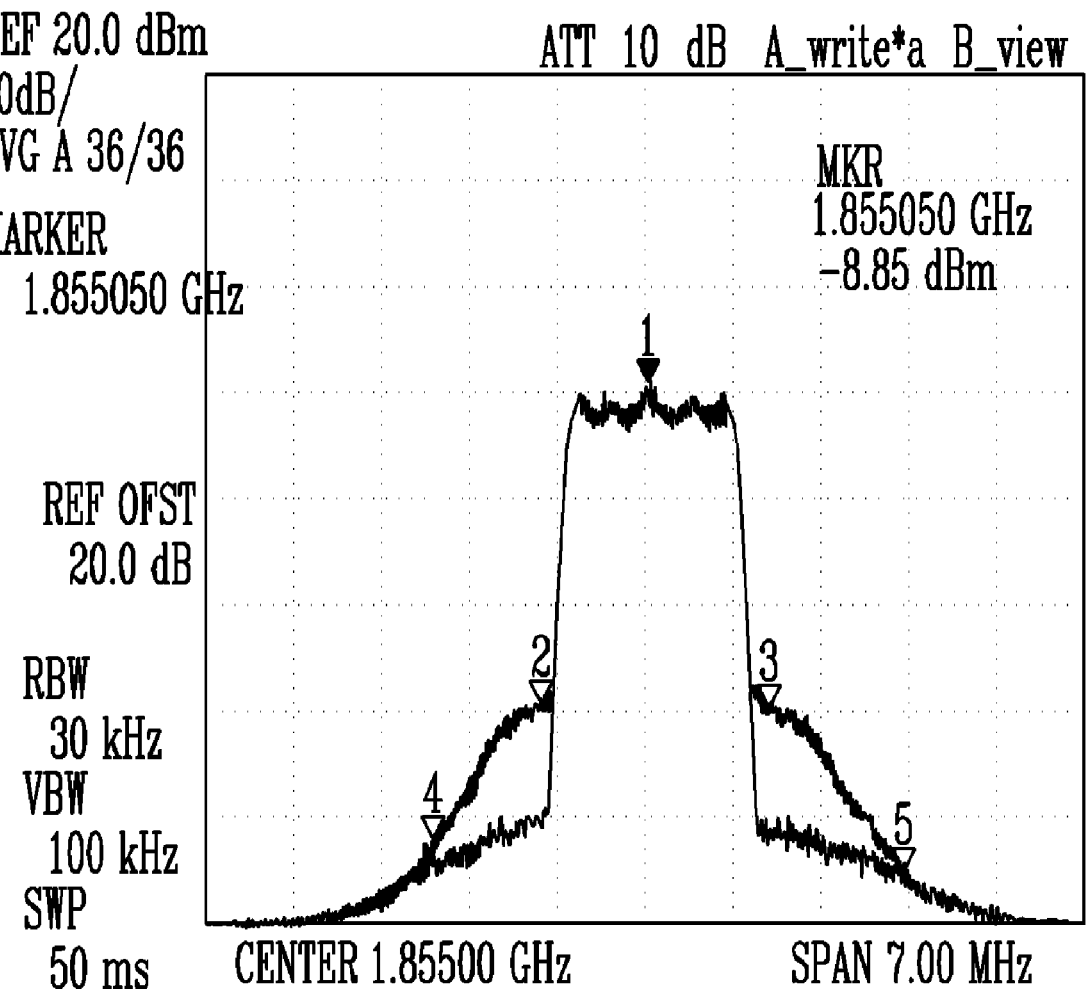

[Fig. 9]
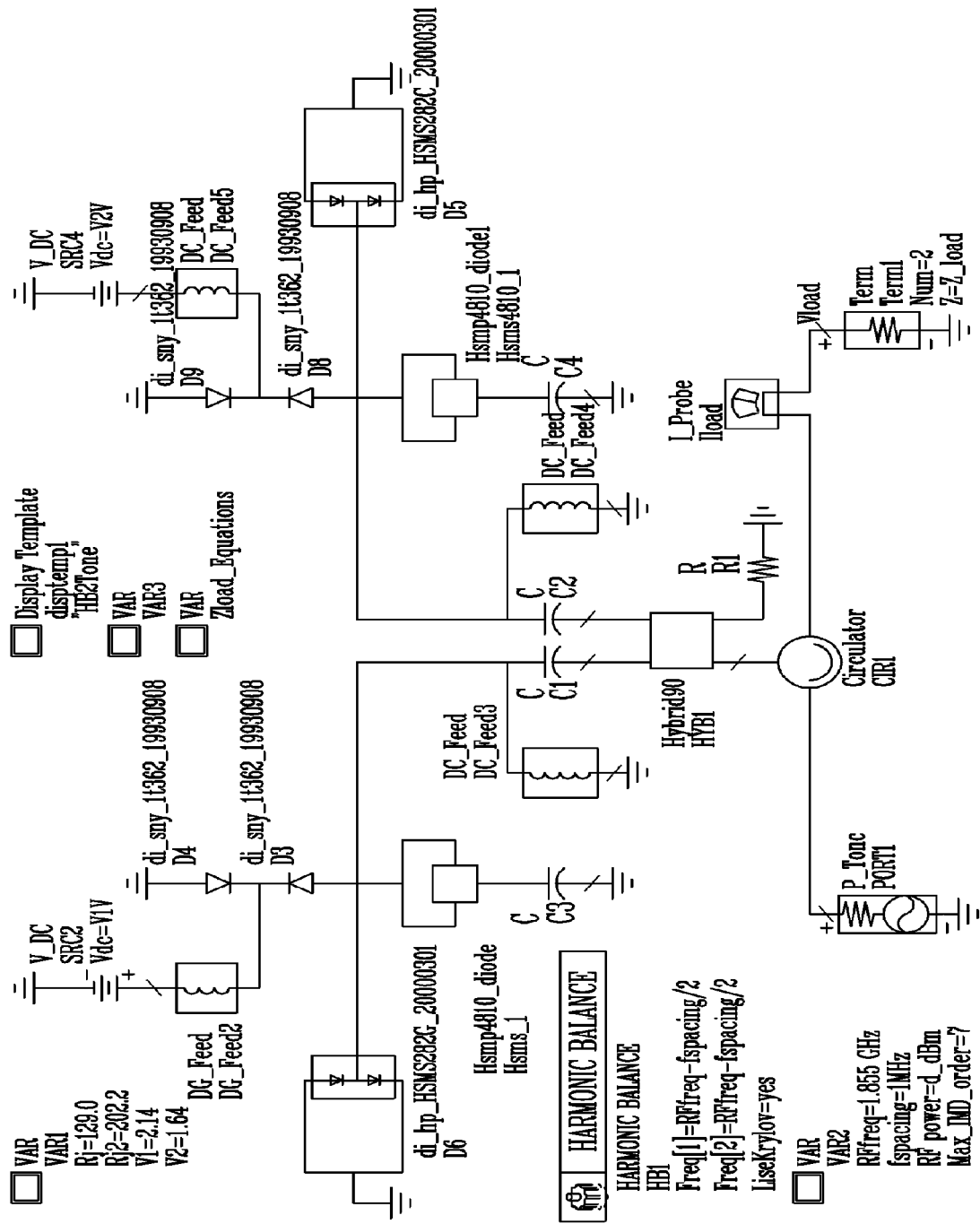

[Fig. 10]
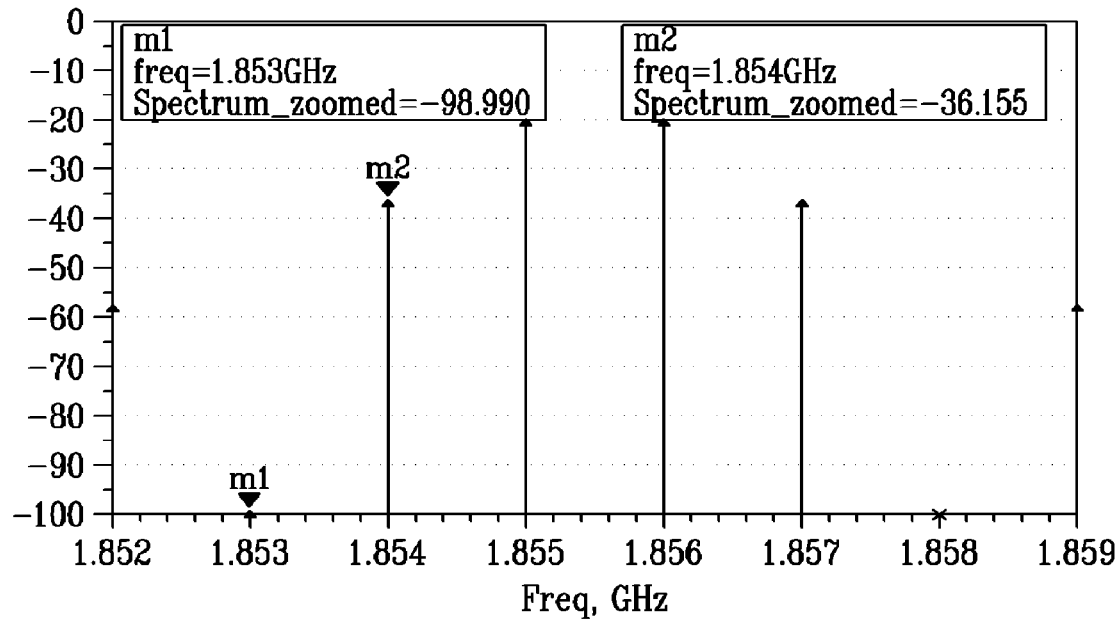
(a)
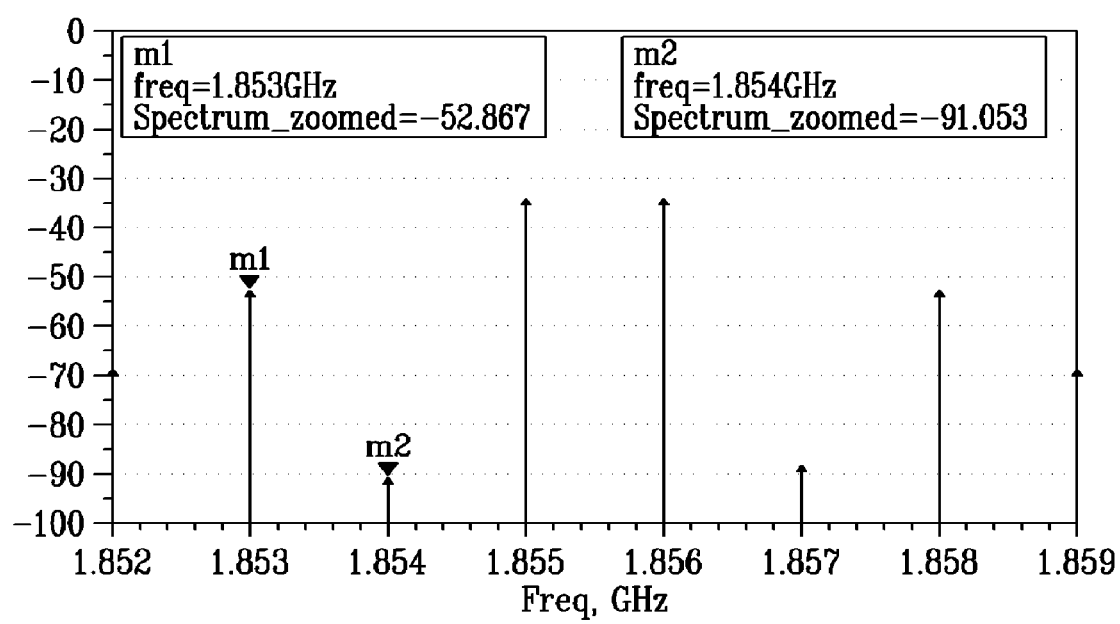
(b)

INTERMODULATION SIGNAL GENERATOR OF POWER AMPLIFIER AND PRE-DISTORTION LINEARIZER HAVING THE SAME

TECHNICAL FIELD

The present invention relates to a power amplifier for a pre-distortion linearizer and, more specifically, to an intermodulation signal generator which generates third- and fifth-order intermodulation signals using Schottky diodes, which are nonlinear components, and a pre-distortion linearizer having the same.

The present invention has been produced from the work supported by the IT R&D program of MIC (Ministry of Information and Communication)/IITA (Institute for Information Technology Advancement) [2005-S-002-02, Development of cognitive radio technology for efficient spectrum utilization] in Korea.

BACKGROUND ART

Recent mobile communication systems use modulation methods, such as code division multiple access (CDMA), quadrature amplitude modulation (QAM), and quadrature phase shift keying (QPSK), in order to make good use of frequency resources.

The above-described conventional modulation methods require the linearity of a power amplifier because of a high peak-to-average power ratio (PAPR) radio-frequency (RF) signals and large envelope fluctuations. However, since the power amplifier operates near a saturation region having a strong nonlinear characteristic in order to maximize the output of power and efficiency, gains and phases of power amplifier signals are distorted.

Therefore, the power amplifier requires an additional linearizer for compensating the nonlinear characteristic of the power amplifier. In order to overcome the nonlinear characteristic of the power amplifier, a feed-forward linearizer and a pre-distortion linearizer have been conventionally proposed.

In the case of a power amplifier using a feed-forward linearizer, signals are dividedly applied to a main path and a sub-path, and carrier signals (or a tone signal and its corresponding signals) on the main path are amplified to a predetermined level by a main amplifier as the power amplifier and then output.

Intermodulation signals of the main amplifier are selectively output by a 3 dB hybrid coupler and attenuated to a predetermined level by an attenuator. The 3 dB hybrid coupler offsets the attenuated signals and signals that are applied to the sub-path and delayed via a first delay loop, so that the intermodulation signals are synthesized.

The resulting signals that are synthesized by the 3 dB hybrid coupler are applied to an error amplifier so that errors of the synthesized signals are corrected and the corrected signals are amplified. Thereafter, the corrected and amplified signals are amplified on the main path and synthesized with signals, which are delayed by a predetermined time via a second delay loop, and output. In the synthesization process, intermodulation distortion (IMD) signals are offset and output.

Meanwhile, in the case of a power amplifier using a pre-distortion linearizer, an applied carrier signal is pre-distorted beforehand by a predetermined pre-distorter. The pre-distorted signal is amplified to a predetermined level by a main amplifier and output. In other words, a pre-distorted signal is generated beforehand and offset by a pre-distorted signal portion of an applied signal, and the remaining portion of the applied signal is amplified and output. In general, the power amplifier using the pre-distortion linearizer can have a small and lightweight structure with a broad bandwidth and a wide operating range at low cost.

A conventional pre-distorter includes separate third- and fifth-order intermodulation signal generators.

FIG. 1 is a circuit construction diagram of a conventional third-order intermodulation signal generator.

Referring to FIG. 1, the third-order intermodulation signal generator includes 90-degree hybrid coupler (i.e., 90-degree directional coupler) 1, a capacitor C, an inductor L, a diode D, and a resistor R, which are interposed between RF input/output signal terminals $RF_{in}/RF_{out}$.

However, it is difficult to extract only third- and fifth-order intermodulation signal components using the conventional third-order intermodulation signal generator. In order to generate fifth-order intermodulation signals, it is necessary to adopt an additional fifth-order intermodulation signal generator having a different structure from the third-order intermodulation signal generator or an additional complicated circuit.

Also, since the conventional pre-distorter employs intermodulation signal components generated by only one kind of diode D, it is difficult to generate desired third- and fifth-order intermodulation signals.

DISCLOSURE OF INVENTION

Technical Problem

The present invention is directed to an intermodulation signal generator of a power amplifier, which can generate third- and fifth-order intermodulation signals using two Schottky diodes having different characteristics.

Also, the present invention is directed to a pre-distortion linearizer including an intermodulation signal generator, which is obtained by improving a conventional pre-distortion linearizer that is inferior in improvement of linearity compared to other linearizers, in spite of an advantage of having a small and lightweight structure with a broad bandwidth and a wide operating range, and thus can be applied to a power amplifier of a high-performance downscaled communication system.

Technical Solution

One aspect of the present invention provides an intermodulation signal generator of a power amplifier. The intermodulation signal generator includes: a circulator for outputting a radio-frequency (RF) input signal input via a first port to a second port and outputting an intermodulation signal input via the second port to a third port; a directional coupler for shifting phases of the input signals input via the second port of the circulator to divide or couple the phase-shifted signals; first and second Schottky diodes, disposed symmetrically, for receiving the signals divided by the directional coupler to generate intermodulation signal components; first and second phase adjusters, disposed symmetrically, for controlling phases of the intermodulation signal components generated by the first and second Schottky diodes by means of first and second bias voltages; and first and second scalers, disposed symmetrically, for controlling magnitudes of the intermodulation signal components generated by the first and second Schottky diodes by means of third and fourth bias voltages.

The directional coupler may be a 90-degree hybrid coupler.

The first and second Schottky diodes may have different characteristics and generate intermodulation signal components having different properties.

Each of the first and second phase adjusters may include a varactor diode.

Each of the first and second scalers may include a pin diode.

The intermodulation signal generator may further include: a first directional coupler for shifting phases of RF input signals to divide or couple the phase-shifted signals; a variable attenuator and phase shifter for receiving one of the signals divided by the first directional coupler, and eliminating a main carrier signal from the received signal; a delay line for delaying the intermodulation signal output via the third port of the circulator by a predetermined delay time; and a second directional coupler for coupling a signal output from the variable attenuator and phase shifter to the intermodulation signal output via the delay line.

Each of the first and second directional couplers may be a 90-degree hybrid coupler.

Another aspect of the present invention provides a pre-distortion linearizer including: a first divider for dividing an RF input signal to output divided signals to a main path and a sub-path; an automatic level control (ALC) circuit for controlling the divided RF signal output from the first divider to the sub-path to a predetermined level to output the controlled signal; second through fourth dividers for power dividing the signal output from the ALC circuit into four to output the divided signals; first and third variable attenuators and phase shifters for eliminating main carrier signals from first and third signals output from the third and fourth dividers, respectively; first and third delay lines for delaying output signals of the first and third variable attenuators and phase shifters by a predetermined delay time; first and third error amplifiers for amplifying second and fourth signals output from the third and fourth dividers to a predetermined extent; first and second isolators for isolating the signals amplified by the first and third error amplifiers, respectively; third- and fifth-order intermodulation signal generators for receiving the signals isolated by the first and second isolators to generate third- and fifth-order intermodulation signals, respectively; a first coupler for coupling the signal delayed via the first delay line to the third-order intermodulation signal generated by the third-order intermodulation signal generator; a second coupler for coupling the signal delayed via the third delay line to the fifth-order intermodulation signal generated by the fifth-order intermodulation signal generator; second and fourth delay lines for delaying the signals coupled by the first and second couplers by a predetermined delay time; second and fourth variable attenuators and phase shifters for eliminating main carrier signals from the signals delayed via the second and fourth delay lines, respectively; second and fourth error amplifiers for amplifying output signals of the second and fourth variable attenuators and phase shifters to a predetermined extent; a third coupler for coupling the signal amplified by the second error amplifier to the signal amplified by the fourth error amplifier; a fifth delay line for delaying the divided RF signal output from the first divider to the main path by a predetermined delay time; and a fourth coupler for coupling the signal coupled by the third coupler to the signal delayed via the fifth delay line to output the resulting signal to a main amplifier.

That is, an RF input signal is extracted by a third- and fifth-order intermodulation signal generator according to an embodiment of the present invention, and is applied to a power amplifier to generate third- and fifth intermodulation signals. Thus, the nonlinear characteristic of the power amplifier can be compensated for due to the suppression characteristics of the third- and fifth-order intermodulation signals. As a consequence, the power amplifier can employ a pre-distortion linearizer having high linearity.

Advantageous Effects

According to the present invention, an intermodulation signal generator of a power amplifier and a pre-distortion linearizer having the same have the following effects.

First, an improved intermodulation signal generator can extract third- and fifth-order intermodulation signals and input the third- and fifth-order intermodulation signals to a power amplifier, and thus, as a power amplifier operates in the saturated region having a strong nonlinear characteristic in order to maximize the output of power and efficiency, the intermodulation signal generator can compensate the nonlinear characteristic caused by the operation of the power amplifier.

Second, the improved intermodulation signal generator can separately generate third- and fifth-order intermodulation signals and control the levels of the respective signals, thereby enhancing the linearity of the power amplifier.

Third, by synthesizing the nonlinear characteristics of two Schottky diodes having different properties, only one of clear third- and fifth-order intermodulation signals can be obtained, and also, the intermodulation signal generator, which is set to each of the third- and fifth-order intermodulation signals, employs an ALC circuit to control an input signal to a constant level so that stable third- and fifth-order intermodulation signal components can be generated.

Fourth, a pre-distortion linearizer according to the present invention can be obtained by improving a conventional pre-distortion linearizer that is inferior in the improvement of linearity compared to other linearizers, in spite of an advantage of having a miniature, lightweight structure with a broad bandwidth and a wide operational range, and thus, the pre-distortion linearizer according to the present invention can be applied to a power amplifier of a high-performance downscaled communication system.

BRIEF DESCRIPTION OF THE DRAWINGS

FIG. 1 is a circuit construction diagram of a conventional third-order intermodulation signal generator;

FIG. 2 is a circuit construction diagram of an intermodulation signal generator of a power amplifier according to an embodiment of the present invention;

FIG. 3 illustrates intermodulation signal components generated by first and second Schottky diodes having different characteristics shown in FIG. 2;

FIG. 4 illustrates third- and fifth-order intermodulation signal components generated by the intermodulation signal generator of the power amplifier shown in FIG. 2;

FIG. 5 is a construction diagram of a circuit for eliminating a main carrier signal from third- and fifth-order intermodulation signals generated by an intermodulation signal generator of a power amplifier according to an embodiment of the present invention;

FIG. 6 illustrates third- and fifth-order intermodulation signal components obtained by eliminating a main carrier signal from third- and fifth-order intermodulation signals generated by the intermodulation signal generator of the power amplifier shown in FIG. 2;

FIG. 7 is a circuit construction diagram of a pre-distortion linearizer having an intermodulation signal generator of a power amplifier according to an embodiment of the present invention;

FIG. 8 is a graph showing experimental results obtained before and after the linearization of a 30W AB-class power amplifier using an intermodulation signal generator and a pre-distortion linearizer according to an embodiment of the present invention;

FIG. 9 is a circuit construction diagram for an advanced design system (ADS) simulation of an intermodulation signal generator of a power amplifier according to an embodiment of the present invention; and FIG. 10 illustrates third- and fifth-order intermodulation signal components generated by the ADS simulation shown in FIG. 9.

DESCRIPTION OF MAJOR SYMBOLS IN THE ABOVE FIGURES

100: Intermodulation signal generator
110: Circulator
120: 90-degree hybrid coupler
130a, 130b: First and second inductor-capacitor (LC) circuits
140a, 140b: First and second Schottky diodes
150a, 150b: First and second phase adjusters
160a, 160b: First and second scalers

MODE FOR THE INVENTION

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to those skilled in the art.

FIG. 2 is a circuit construction diagram of an intermodulation signal generator of a power amplifier according to an embodiment of the present invention.

Referring to FIG. 2, an intermodulation signal generator 100 of a power amplifier according to an embodiment of the present invention includes a circulator 110 and a 90-degree hybrid coupler (i.e., 90-degree directional coupler) 120, which are used to improve a reflection characteristic, and various kinds of symmetrical diodes and bias lines, which are used to generate intermodulation signals and adjust the intermodulation signals according to the individual order. That is, the symmetrical diodes and bias lines include first and second inductor-capacitor (LC) circuits 130a and 130b, first and second Schottky diodes 140a and 140b, first and second phase adjusters 150a and 150b, and first and second scalers 160a and 160b.

The circulator 110, which is coupled between RF input/output signal terminals $RF_{in}/RF_{out}$, outputs a signal input via a first port P1 to a second port P2 and outputs a signal input via the second port P2 to a third port P3.

The first port P1 is coupled to the RF input signal terminal $RF_{in}$, the second port P2 is coupled to an input port 121 of the 90-degree directional coupler 120, and the third port P3 is coupled to the RF output signal terminal $RF_{out}$.

The 90-degree directional coupler 120 shifts the phases of input signals by 90 degrees and divides or couples the phase-shifted signals.

The 90-degree directional coupler 120 includes four ports, that is, the input port 121, an isolated port 122, a coupled port 123, and a through port 124. The input port 121 is diagonally coupled to the through port 124, and the isolated port 122 is diagonally coupled to the coupled port 123.

The operations of the 90-degree directional coupler 120 will now be described. To begin, when a signal output from the second port P2 of the circulator 110 is input to the input port 121, the signal is dividedly applied to the coupled port 123 and the through port 124.

The divided signals are reflected again in the coupled port 123 and the through port 124, respectively. The reflected signals are vector-synthesized in the isolated port 122 and output.

In this case, however, since the isolated port 122 is coupled to a ground terminal GND by a 50-Ω impedance resistor 125, the signal reflected in the coupled port 123 is totally reflected by the terminal impedance of the short-circuit isolated port 122. The totally reflected signal is output again to the input port 121.

Also, the coupled port 123 and the through port 124 of the 90-degree directional coupler 120 are respectively coupled to the first and second LC circuits 130a and 130b, each of which has one terminal coupled to a ground terminal GND.

The first LC circuit 130a includes a first bypass capacitor C1 and a first inductor L1, which are coupled in series between the coupled port 123 and the ground terminal GND, and the second LC circuit 130b includes a second bypass capacitor C2 and a second inductor L2, which are coupled in series between the through port 124 and the ground terminal GND.

The first and second Schottky diodes 140a and 140b are nonlinear components having different characteristics and function to generate intermodulation signal components with different properties.

Each of the first and second Schottky diodes 140a and 140b has one terminal coupled to a ground terminal GND. The other terminal of the first Schottky diode 140a is coupled between the first bypass capacitor C1 and the first inductor L1, and the other terminal of the second Schottky diode 140b is coupled between the second bypass capacitor C2 and the second inductor L2.

The first and second phase adjusters 150a and 150b function to adjust the phases of the intermodulation signal components generated by the first and second Schottky diodes 140a and 140b by use of first and second bias control voltages Vcc1 and Vcc2.

The first phase adjuster 150a includes a first varactor diode 151a and a third inductor L3 that are coupled in series. The third inductor L3 has one terminal coupled to a terminal of the first bias control voltage Vcc1 and the other terminal coupled to one terminal of the first varactor diode 151a. Also, the other terminal of the first varactor diode 151 a is coupled to a ground terminal GND and the other terminal of the first Schottky diode 140a.

The second phase adjuster 150b includes a second varactor diode 151b and a fourth inductor L4 that are coupled in series. The fourth inductor L4 has one terminal coupled to a terminal of the second bias control voltage Vcc2 and the other terminal coupled to one terminal of the second varactor diode 151b. Also, the other terminal of the second varactor diode 151b is coupled to a ground terminal GND and the other terminal of the second Schottky diode 140b.

Also, the first and second scalers 160a and 160b function to control the magnitudes of the intermodulation signal components generated by the first and second Schottky diodes 140a and 140b by use of third and fourth bias control voltages Vcc3 and Vcc4.

The first scaler 160a includes a first pin diode 165a, a fifth inductor L5, and a third bypass capacitor C3.

The first pin diode 165a has one terminal coupled to the other terminal of the first Schottky diode 140a and the other terminal coupled to a ground terminal GND by the third bypass capacitor C3. The fifth inductor L5 has one terminal coupled to a terminal of the third bias control voltage Vcc3 and the other terminal coupled to the other terminal of the first pin diode 165a.

The second scaler 160b includes a second pin diode 165b, a sixth inductor L6, and a fourth bypass capacitor C4.

The second pin diode 165b has one terminal coupled to the other terminal of the second Schottky diode 140b and the other terminal coupled to a ground terminal GND by the fourth bypass capacitor C4. The sixth inductor L6 has one terminal coupled to a terminal of the fourth bias control voltage Vcc4 and the other terminal coupled to the other terminal of the second pin diode 165b.

In other words, by finding a voltage point in a case where a third-order intermodulation signal component is dominant and a voltage point in a case where a fifth-order intermodulation signal component is dominant by controlling the respective bias control voltages Vcc1 to Vcc4, the above-described intermodulation signal generator can function as both third- and fifth-order intermodulation signal generators.

As described above, the intermodulation signal generator 100 according to an embodiment of the present invention can appropriately control a voltage applied to a varactor diode and a voltage applied to a pin diode and synthesize the nonlinear characteristics of two different Schottky diodes, so that a three-order intermodulation signal component and a fifth-order intermodulation signal component can be obtained using the same hardware structure.

FIG. 3 illustrates intermodulation signal components generated by the first and second Schottky diodes 140a and 140b having different characteristics as shown in FIG. 2. Specifically, (a) of FIG. 3 illustrates an intermodulation signal component generated by the first Schottky diode 140a (HSMS-2852), and (b) of FIG. 3 illustrates an intermodulation signal component generated by the second Schottky diode 140b (HSMS-282c). As can be seen from FIG. 3, when an RF signal was applied to the two different Schottky diodes 140a and 140b, the Schottky diodes 140a and 140b generated intermodulation signal components having different properties.

FIG. 4 illustrates third- and fifth-order intermodulation signal components generated by the intermodulation signal generator of the power amplifier as shown in FIG. 2. Specifically, (a) of FIG. 4 illustrates a third-order intermodulation signal generated by appropriately adjusting a voltage in the intermodulation signal generator 100 shown in FIG. 2, and (b) of FIG. 4 illustrates a fifth-order intermodulation signal generated by appropriately adjusting a voltage in the intermodulation signal generator 100 shown in FIG. 2.

As can be seen from FIG. 4, the intermodulation signal generator 100 according to the present invention generated not only the desired third- and fifth-order intermodulation signal components but also a main carrier signal. Therefore, a third-order intermodulation signal component could be obtained as can be seen from (a) of FIG. 6 by means of a main carrier elimination circuit shown in FIG. 5, and a fifth-order intermodulation signal component could be obtained as can be seen from (b) of FIG. 6 by means of the main carrier elimination circuit shown in FIG. 5.

FIG. 5 is a construction diagram of a circuit for eliminating a main carrier signal from third- and fifth-order intermodulation signals generated by an intermodulation signal generator of a power amplifier according to an embodiment of the present invention.

Referring to FIG. 5, a main carrier elimination circuit includes a first directional coupler 200, a variable attenuator and phase shifter 300, a delay line 400, and a second directional coupler 500. Specifically, the first directional coupler 200 is coupled between an RF input signal terminal RF and an intermodulation signal generator 100 and shifts the phases of RF signals to divide or couple the phase-shifted signals. The variable attenuator and phase shifter 300 receives one of signals divided by the first directional coupler 200 and eliminates a main carrier signal. The delay line 400 delays an intermodulation signal output from the intermodulation signal generator 100 by a predetermined delay time. The second directional coupler 500 couples a signal output from the variable attenuator and phase shifter 300 to the intermodulation signal output from the delay line 400 and outputs the resulting signal to an RF output signal terminal $RF_{out}$.

In this case, each of the first and second directional couplers 200 and 500 may be embodied by a 90-degree hybrid coupler.

FIG. 6 illustrates third- and fifth-order intermodulation signal components obtained by eliminating a main carrier signal from third- and fifth-order intermodulation signals generated by the intermodulation signal generator of the power amplifier shown in FIG. 2. Specifically, (a) of FIG. 6 illustrates the elimination of a main carrier signal from a third-order intermodulation signal generated by the intermodulation signal generator 100 according to the present invention using the main carrier elimination circuit shown in FIG. 5, and (b) of FIG. 6 illustrates the elimination of a main carrier signal from a fifth-order intermodulation signal generated by the intermodulation signal generator 100 according to the present invention using the main carrier elimination circuit shown in FIG. 5.

FIG. 7 is a circuit construction diagram of a pre-distortion linearizer having an intermodulation signal generator of a power amplifier according to an embodiment of the present invention.

Referring to FIG. 7, the pre-distortion linearizer having the intermodulation signal generator of the power amplifier according to the embodiment of the present invention includes a first divider 600, an automatic level control (ALC) circuit 601, second through fourth dividers 602 to 604, a first variable attenuator and phase shifter 605, a first delay line 606, a first error amplifier 607, a first isolator 608, a third-order intermodulation signal generator 100, a first coupler 609, a second delay line 610, a second variable attenuator and phase shifter 611, a second error amplifier 612, a third variable attenuator and phase shifter 613, a third delay line 614, a third error amplifier 615, a second isolator 616, a fifth-order intermodulation signal generator 100, a second coupler 617, a fourth delay line 618, a fourth variable attenuator and phase shifter 619, a fourth error amplifier 620, a third coupler 621, a fifth delay line 622, and a fourth coupler 624.

Specifically, the first divider 600 divides an RF input signal and outputs the divided RF signals to a main path and a sub-path. The ALC circuit 601 controls the divided RF signal, which is output from the first divider 600 to the sub-path, to a predetermined level and outputs the controlled signal. The second through fourth dividers 602 to 604 divide the power of the signal into four, and output the divided signals. The first variable attenuator and phase shifter 605 eliminates a main carrier signal from a first signal output from the third divider 603. The first delay line 606 delays a signal output from the first variable attenuator and phase shifter 605 by a predetermined delay time. The first error amplifier 607 amplifies a second signal output from the third divider 603 to a predetermined extent. The first isolator 608 isolates the signal amplified by the first error amplifier 607. The third-order intermodulation signal generator 100 receives the signal isolated by the first isolator 608 and generates a third-order intermodulation signal. The first coupler 609 couples the signal delayed via the first delay line 606 to the third-order intermodulation signal generated by the third-order intermodulation signal generator 100. The second delay line 610 delays the signal coupled by the first coupler 609 by a predetermined delay time. The second variable attenuator and phase shifter 611 eliminates a main carrier signal from the signal delayed via the second delay line 610. The second error amplifier 612 amplifies the signal output from the second variable attenuator and phase shifter 611 to a predetermined extent. The third variable attenuator and phase shifter 613 eliminates a main carrier signal from a third signal output from the fourth divider 604. The third delay line 614 delays a signal output from the third variable attenuator and phase shifter 613 by a predetermined delay time. The third error amplifier 615 amplifies a fourth signal output from the fourth divider 604 to a predetermined extent. The second isolator 616 isolates the signal amplified by the third error amplifier 615. The fifth-order intermodulation signal generator 100 receives the signal isolated by the second isolator 616 and generates a fifth-order intermodulation signal. The second coupler 617 couples the signal delayed via the third delay line 614 to the fifth-order intermodulation signal generated by the intermodulation signal generator 100. The fourth delay line 618 delays the signal coupled by the second coupler 617 by a predetermined delay time. The fourth variable attenuator and phase shifter 619 eliminates a main carrier signal from the signal delayed via the fourth delay line 618. The fourth error amplifier 620 amplifies a signal output from the fourth variable attenuator and phase shifter 619 to a predetermined extent. The third coupler 621 couples the signal amplified by the second error amplifier 612 to the signal amplified by the fourth error amplifier 620. The fifth delay line 622 delays the divided RF signal, which is output from the first divider 600 to the main path, by a predetermined delay time. The fourth coupler 624 couples the signal coupled by the third coupler 621 to the signal delayed via the fifth delay line 622 and outputs the coupled signal to a main amplifier 700.

In this case, the fifth delay line 622 delays the RF signal input to the main path so that the RF signal input to the sub-path is applied to the fourth coupler 624 in synchronization with the RF signal that is input to the main path.

The above-described pre-distortion linearizer operates on the principle that an RF input signal is divided by the first divider 600 and output to the main path and the sub-path for generating the intermodulation signal. The main path requires the fifth delay line 622 in order to compensate the delay times of all apparatuses for generating the intermodulation signals.

The ALC circuit 601 controls the signal input to the sub-path to a constant level irrespective of the level of the entire input signal so that signals input to the third- and fifth-order intermodulation signal generators 100 can be clamped at appropriate levels. An output signal of the ALC circuit 601 is divided again by the second through fourth dividers 602 to 604 into signals having the same magnitude and phase and input to the third- and fifth-order signal generators 100, respectively. The third- and fifth-order intermodulation signals generated by the third- and fifth-order signal generators 100 are controlled in magnitude and phase, coupled by the fourth coupler 624, coupled again at an input terminal of the power amplifier, i.e., the main amplifier 700, and applied. The third- and fifth-order intermodulation signals, having opposite characteristics to the nonlinear characteristic of the power amplifier, lead to the linearization of a nonlinear power amplifier in a saturated region.

FIG. 8 is a graph showing experimental results obtained before and after the linearization of a 30W AB-class power amplifier using an intermodulation signal generator and a pre-distortion linearizer according to an embodiment of the present invention. When a code division multiple access (CDMA) signal was input, the linearization result of 10 dB was obtained in the range of 1840 to 1870 MHz.

FIG. 9 is a circuit construction diagram of an advanced design system (ADS) simulation of an intermodulation signal generator of a power amplifier according to an embodiment of the present invention, and FIG. 10 illustrates third- and fifth-order intermodulation signal components generated by the ADS simulation shown in FIG. 9. As can be seen from (a) of FIG. 10, a desired third-order intermodulation signal was generated only by controlling the voltages of a varactor diode and a pin diode. Similarly, it can be confirmed from (b) of FIG. 10 that a desired fifth-order intermodulation signal was generated only by controlling the voltages of a varactor diode and a pin diode.

As described above, a pre-distortion linearizer can exhibit an excellent linear characteristic by obtaining a distortion characteristic that is precisely opposite to the nonlinear characteristic of a power amplifier.

The intermodulation distortion transmission characteristic of the power amplifier as described above is dependent upon the individual order of an intermodulation signal and the power level of an input signal. Therefore, intermodulation signals are generated according to the individual order and a pre-distorter independently adjusting the amplitudes and phases of the intermodulation signals so that the pre-distortion linearizer can improve a linear characteristic.

In the drawings and specification, there have been disclosed typical preferred embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

The invention claimed is:

1. An intermodulation signal generator of a power amplifier, comprising:
   a circulator for outputting a radio-frequency (RF) input signal input via a first port to a second port and outputting an intermodulation signal input via the second port to a third port;
   a directional coupler for shifting phases of the input signals input via the second port of the circulator to divide or couple the phase-shifted signals;
   first and second Schottky diodes, disposed symmetrically, for receiving the signals divided by the directional coupler to generate intermodulation signal components;
   first and second phase adjusters, disposed symmetrically, for controlling phases of the intermodulation signal components generated by the first and second Schottky diodes by means of first and second bias voltages; and
   first and second scalers, disposed symmetrically, for controlling magnitudes of the intermodulation signal components generated by the first and second Schottky diodes by means of third and fourth bias voltages.

2. The intermodulation signal generator according to claim 1, wherein the directional coupler is a 90-degree hybrid coupler.

3. The intermodulation signal generator according to claim 1, wherein the first and second Schottky diodes have different characteristics and generate intermodulation signal components having different properties.

4. The intermodulation signal generator according to claim 1, wherein each of the first and second phase adjusters comprises a varactor diode.

5. The intermodulation signal generator according to claim 1, wherein each of the first and second scalers comprises a pin diode.

6. The intermodulation signal generator according to claim 1, further comprising:
- a first directional coupler for shifting phases of RF input signals to divide or couple the phase-shifted signals;
- a variable attenuator and phase shifter for receiving one of the signals divided by the first directional coupler, and eliminating a main carrier signal from the received signal;
- a delay line for delaying the intermodulation signal output via the third port of the circulator by a predetermined delay time; and
- a second directional coupler for coupling a signal output from the variable attenuator and phase shifter to the intermodulation signal output via the delay line.

7. The intermodulation signal generator according to claim 6, wherein each of the first and second directional couplers is a 90-degree hybrid coupler.

8. A pre-distortion linearizer comprising:
- a first divider for dividing an RF input signal to output divided signals to a main path and a sub-path;
- an automatic level control (ALC) circuit for controlling the divided RF signal output from the first divider to the sub-path to a predetermined level to output the controlled signal;
- second through fourth dividers for power dividing the signal output from the ALC circuit into four to output the divided signals;
- first and third variable attenuators and phase shifters for eliminating main carrier signals from first and third signals output from the third and fourth dividers, respectively;
- first and third delay lines for delaying output signals of the first and third variable attenuators and phase shifters by a predetermined delay time;
- first and third error amplifiers for amplifying second and fourth signals output from the third and fourth dividers to a predetermined extent;
- first and second isolators for isolating the signals amplified by the first and third error amplifiers, respectively;
- third- and fifth-order intermodulation signal generators for receiving the signals isolated by the first and second isolators to generate third- and fifth-order intermodulation signals, respectively;
- a first coupler for coupling the signal delayed via the first delay line to the third-order intermodulation signal generated by the third-order intermodulation signal generator;
- a second coupler for coupling the signal delayed via the third delay line to the fifth-order intermodulation signal generated by the fifth-order intermodulation signal generator;
- second and fourth delay lines for delaying the signals coupled by the first and second couplers by a predetermined delay time;
- second and fourth variable attenuators and phase shifters for eliminating main carrier signals from the signals delayed via the second and fourth delay lines, respectively;
- second and fourth error amplifiers for amplifying output signals of the second and fourth variable attenuators and phase shifters to a predetermined extent;
- a third coupler for coupling the signal amplified by the second error amplifier to the signal amplified by the fourth error amplifier;
- a fifth delay line for delaying the divided RF signal output from the first divider to the main path by a predetermined delay time; and
- a fourth coupler for coupling the signal coupled by the third coupler to the signal delayed via the fifth delay line to output the resulting signal to a main amplifier.

9. The pre-distortion linearizer according to claim 8, wherein each of the third- and fifth-order intermodulation signal generators comprises:
- a circulator for outputting an RF input signal input via a first port to a second port and outputting an intermodulation signal input via the second port to a third port;
- a directional coupler for shifting phases of the input signals input via the second port of the circulator to divide or couple the phase-shifted signals;
- first and second Schottky diodes, disposed symmetrically, for receiving the signals divided by the directional coupler to generate intermodulation signal components;
- first and second phase adjusters, disposed symmetrically, for controlling phases of the intermodulation signal components generated by the first and second Schottky diodes by means of first and second bias voltages; and
- first and second scalers, disposed symmetrically, for controlling magnitudes of the intermodulation signal components generated by the first and second Schottky diodes by means of third and fourth bias voltages.

10. The pre-distortion linearizer according to claim 9, wherein the directional coupler is a 90-degree hybrid coupler.

11. The pre-distortion linearizer according to claim 9, wherein the first and second Schottky diodes have different characteristics and generate intermodulation signal components having different properties.

12. The pre-distortion linearizer according to claim 9, wherein each of the first and second phase adjusters comprises a varactor diode.

13. The pre-distortion linearizer according to claim 9, wherein each of the first and second scalers comprises a pin diode.

* * * * *